(12) United States Patent
Grajcar

(10) Patent No.: US 8,324,642 B2
(45) Date of Patent: Dec. 4, 2012

(54) LIGHT EMITTING DIODE ASSEMBLY AND METHODS

(75) Inventor: Zdenko Grajcar, Crystal, MN (US)

(73) Assignee: Once Innovations, Inc., Plymouth, MN (US)

( * ) Notice: Subject to any disclaimer, the term of this patent is extended or adjusted under 35 U.S.C. 154(b) by 300 days.

(21) Appl. No.: 12/705,408

(22) Filed: Feb. 12, 2010

(65) Prior Publication Data

US 2010/0207150 A1  Aug. 19, 2010

Related U.S. Application Data

(60) Provisional application No. 61/152,670, filed on Feb. 13, 2009, provisional application No. 61/234,094, filed on Aug. 14, 2009, provisional application No. 61/233,829, filed on Aug. 14, 2009, provisional application No. 61/255,491, filed on Oct. 28, 2009, provisional application No. 61/298,289, filed on Jan. 26, 2010.

(51) Int. Cl.
*H01L 33/00* (2010.01)
(52) U.S. Cl. ................ 257/98; 257/81; 257/82; 257/88; 257/89; 257/99
(58) Field of Classification Search .................. None
See application file for complete search history.

(56) References Cited

U.S. PATENT DOCUMENTS

| 6,836,491 B2 * | 12/2004 | Itoh | 372/36 |
| 2008/0207015 A1 * | 8/2008 | Sueyoshi | 439/75 |

* cited by examiner

*Primary Examiner* — Kyoung Lee
(74) *Attorney, Agent, or Firm* — McDermott Will & Emery LLP

(57) ABSTRACT

Exemplary systems and methods for LED light engines include an LED package with electrical leads, each lead forming a compliant portion for making electrical and mechanical connection upon insertion into a receptacle of a circuit substrate. In an illustrative example, the electrical and mechanical connections may be formed upon the insertion of the compliant portion into the receptacle and without further process steps involving solder. Various examples may further include an elongated thermal dissipation member extending from a bottom of a package that contains the LED, where the elongated thermal member (e.g., tab) may be in substantial thermal communication with the LED die. As an example, the tab may provide a substantially reduced thermal impedance for dissipating heat from the LED die. Upon insertion into a circuit substrate, the LED package may be releasable by mechanical extraction without applied heat to facilitate repair or replacement, for example.

13 Claims, 6 Drawing Sheets

LIGHT EMITTING DIODE ASSEMBLY AND METHODS

CROSS-REFERENCE TO RELATED APPLICATIONS

This application claims the benefit of: U.S. Provisional Application entitled "Light Emitting Diode Assembly and Methods," Ser. No. 61/152,670, which was filed by Z. Grajcar on Feb. 13, 2009: U.S. Provisional Patent Application entitled "Color Temperature Shift Control for Dimmable AC LED Lighting," Ser. No. 61/234,094, which was filed by Z. Grajcar on Aug. 14, 2009; U.S. Provisional Patent Application entitled "Reduction of Harmonic Distortion for LED Loads," Ser. No. 61/233,829, which was filed by Z. Grajcar on Aug. 14, 2009; U.S. Provisional Patent Application entitled "Architecture for High Power Factor and Low Harmonic Distortion LED Lighting," Ser. No. 61/255,491, which was filed by Z. Grajcar on Oct. 28, 2009; and, U.S. Provisional Patent Application entitled "Sealed LED Light Engines," Ser. No. 61/298,289, which was filed by Z. Grajcar on Jan. 26, 2010, and the entire contents of each of which are incorporated herein by reference.

TECHNICAL FIELD

The present inventions relate to light emitting diodes and, more particularly, to apparatus and methods for making electrical and mechanical connections between a light emitting diode and a circuit substrate.

BACKGROUND

Light emitting diodes (LEDs) and, more particularly, high power LEDs are being used with increasing frequency to replace conventional light bulbs in motor vehicles such as aircraft and automobiles.

In some LED light engines, LEDs may be electrically and/or mechanically connected to a circuit substrate, such as a printed circuit board, using a number of soldered connections. A solder joint may be formed by providing molten solder at each connection to form a solder joint. In some cases, it is desirable to implement a lead-free soldering process. High temperature lead free soldering processes have been traditionally used for attaching surface mount technology (SMT) components to a printed circuit board (PCB) or other circuit substrates. Exposure to high temperature conditions can introduce thermal stress to the LED. Thermal stresses can tend to reduce LED life expectancy and/or light output. With the introduction of heavy copper PCBs and metal core PCBs, higher thermal stresses may be required to achieve adequate solder joints.

SUMMARY

Exemplary systems and methods for LED light engines include an LED package with electrical leads, each lead forming a compliant portion for making electrical and mechanical connection upon insertion into a receptacle of a circuit substrate. In an illustrative example, the electrical and mechanical connections may be formed upon the insertion of the compliant portion into the receptacle and without further process steps involving solder. Various examples may further include an elongated thermal dissipation member extending from a bottom of a package that contains the LED, where the elongated thermal member (e.g., tab) may be in substantial thermal communication with the LED die. As an example, the tab may provide a substantially reduced thermal impedance for dissipating heat from the LED die. Upon insertion into a circuit substrate, the LED package may be releasable by mechanical extraction without applied heat to facilitate repair or replacement, for example.

Various embodiments may achieve one or more advantages. For example, some embodiments may use large metal (e.g., copper, brass, aluminum) leads to substantially reduce or eliminate bulky heat sinks. An LED module having a compliant pin may be secured without soldering. The friction-fit nature of an LED having a compliant pin may provide a substantially gas tight connection with sufficient retention force to maintain a high normal force on the plated through-hole PCB via, thereby eliminating the need for soldering of the LED package. Various examples may substantially resist extraction forces below a specified extraction force. An LED module having a compliant pin may eliminate the high temperature soldering process required for assembly of existing LED packages to a circuit substrate. This may advantageously eliminate a significant amount of the thermal stress induced by reflow soldering, which may yield improved reliability of the LED package and in higher luminous intensity of the LED. In some implementations, an LED package may substantially avoid exposure to high temperatures, which may thereby permit use of less expensive materials with, for example, lower glass transition temperatures. This may further reduce or substantially eliminate expensive, high-temperature plastic materials. The presently disclosed LEDs use of a compliant pin may enable lower temperature materials, use of lower temperature resistant materials like acrylics, such as for example poly(methyl methacrylate), which exhibits suitable optical properties in the manufacture of LEDs for some applications.

An LED module having a compliant pin may reduce or substantially eliminate issues created by soldered-joints and flux residue. When flux residues are dissolved in moisture condensation on the board, electrochemical reactions may take place between conductor traces under an electrical bias, causing reduction in the SIR. If electro migration and dendritic growth occurs, more fatal failures can occur due to the formation of electrical shorts between the conductor traces.

An LED module having a compliant pin may provide high reliability in high vibration and shock applications due to high "flexural modulus" of the assembly. Compliant LED is mechanically inserted into PCB substrate. Eye of the needle part of the compliant LED creates robust but "floating" electrical and mechanical connection. Once exposed to high vibration stress environment, connections "floating" character will assure reliable connection. Most of the lead free soldered LED will fail vibration test due to permanent, rigid nature of the solder joint.

In some examples, an LED module having a compliant pin may be connected to the PCB via "floating" electrical and mechanical connection. This "floating" connection may substantially reduce or eliminate failures associated with strain due to CTE (Coefficient of Thermal Expansion) mismatches between an LED package and the PCB substrate. CTE mismatch strains are particularly evident in the assemblies incorporating metal core PCB (MCPCB) and heavy copper PCB.

The "floating" mechanical connection of an LED module having a compliant pin may allow for easy repairs. Compliant LED can be removed by applying counter retention force.

Advantageously, separation of the LED package during a soldering process may further permit optimization of an assembly process parameter, such as solder temperature profile, for example. In some applications, a compliant pin may allow use of larger thermal slugs and integrated heat sink components. Problems arising from large volumetric thermal capacitance of such packages which can be resolved only by increasing reflow soldering temperature and/or reflow time to compensate for thermal energy needed to heat up large thermal slugs and/or heat sink elements which may contribute to potential die damage, die de-lamination, phosphor degradation etc.

For various applications, such as some light engines with a higher frequency, elimination of solder joints may further advantageously mitigate variability in parasitic capacitance, for example, associated with variability in the amount of solder applied to the joint.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Figure 1:
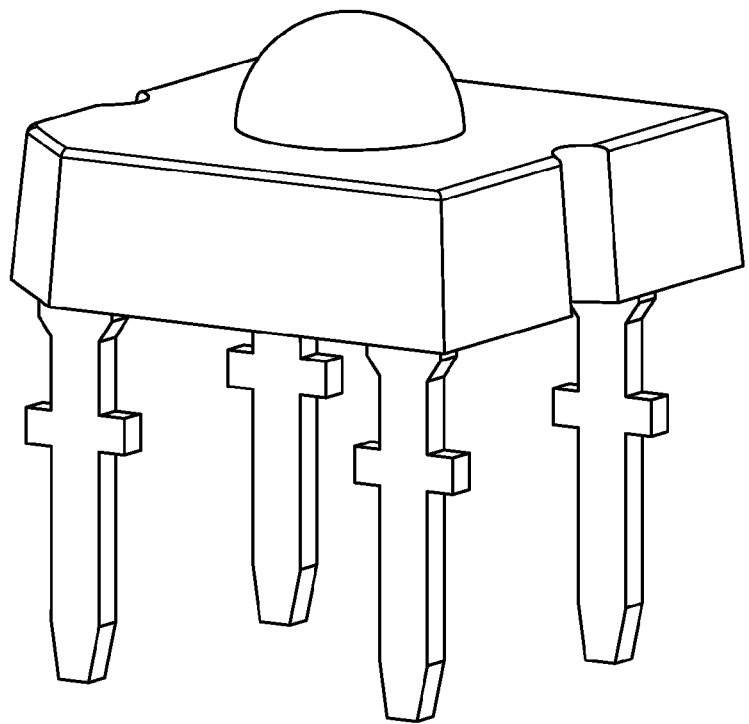
FIG. 1 illustrates a perspective view of a prior art LED.

FIG. 1 illustrates a prior art LED having pins configured for soldering to a PCB.

Figure 2:
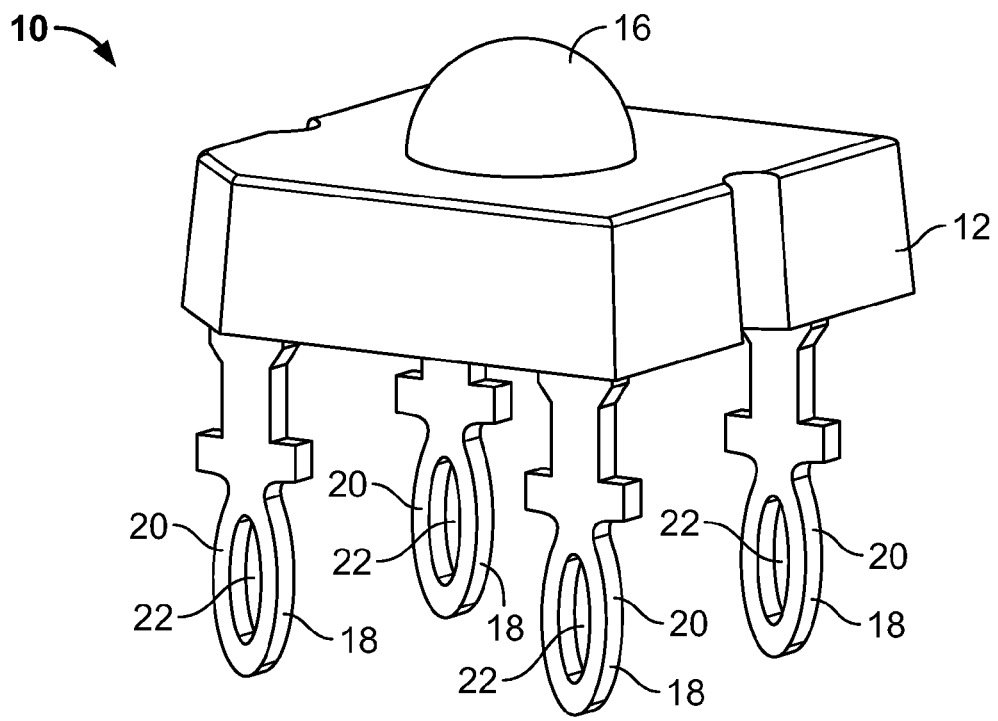
FIG. 2 illustrates a perspective view of an exemplary embodiment of an LED with compliant terminal pins.

FIG. 2 illustrates an LED module 10 including a body 12 for at least one
LED chip 14 (not shown), a lens 16, and terminals 18 that include at least one anode and at least one cathode of the LED. The LED chip 14 is secured to the body 12 and is covered by the lens 16. The LED chip 14 is in electrical communication with at least one of the terminals 18 that is an anode and at least one of the terminals 18 that is a cathode to permit current flow through the LED chip 14. At least a portion of the terminals 18 is configured as a compliant pin 20. At least a portion of the cathode 18 is also configured as a compliant pin 20.

Figure 7:
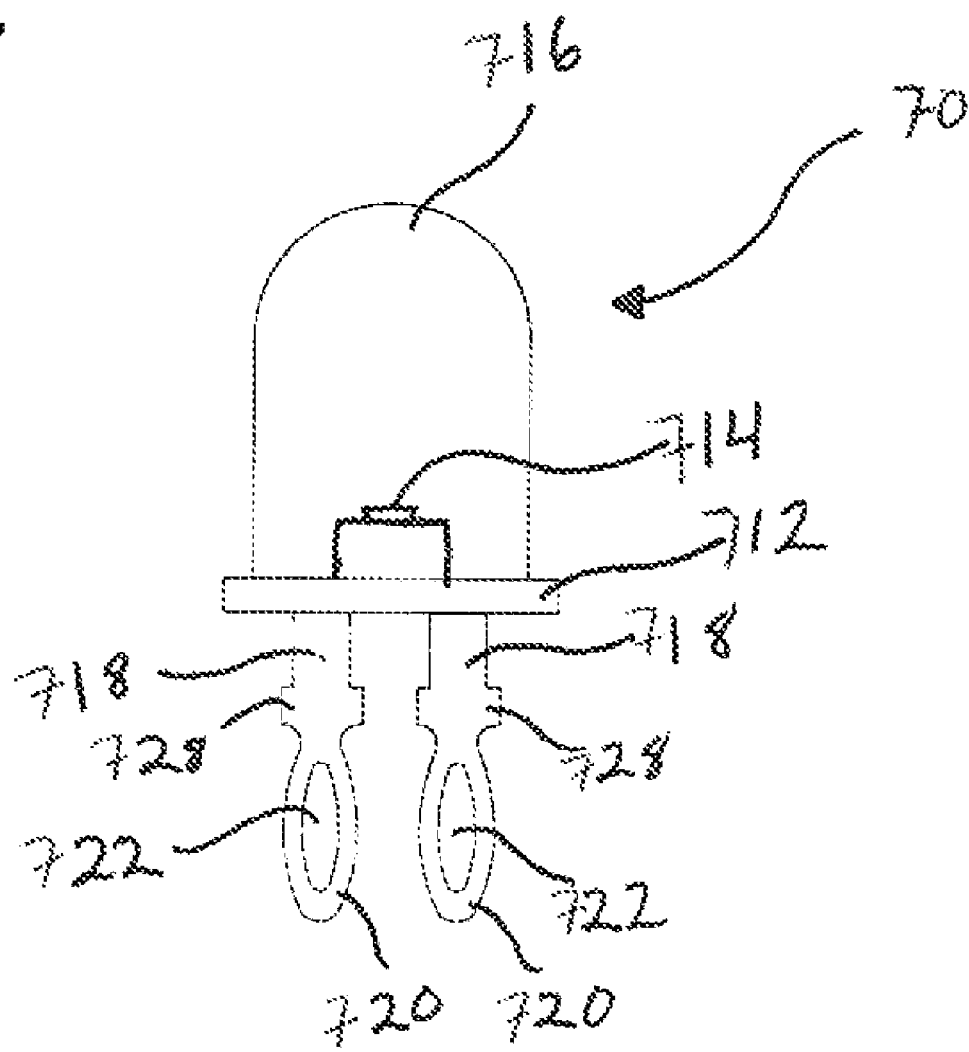
FIG. 7 illustrates a side view of another exemplary embodiment of an LED.

FIG. 7 illustrates another LED module 70 including a body 712, at least one LED chip 714, a lens 716, and terminals 718 that include at least one anode and at least one cathode. The LED chip 714 is secured to the body 712 and is covered by the lens 716. The LED chip 714 is in electrical communication with the anode and the cathode to permit an electric current to flow through the LED chip 714. A distal portion of each of the terminals 18 is configured as a compliant pin 720.

Figure 8:
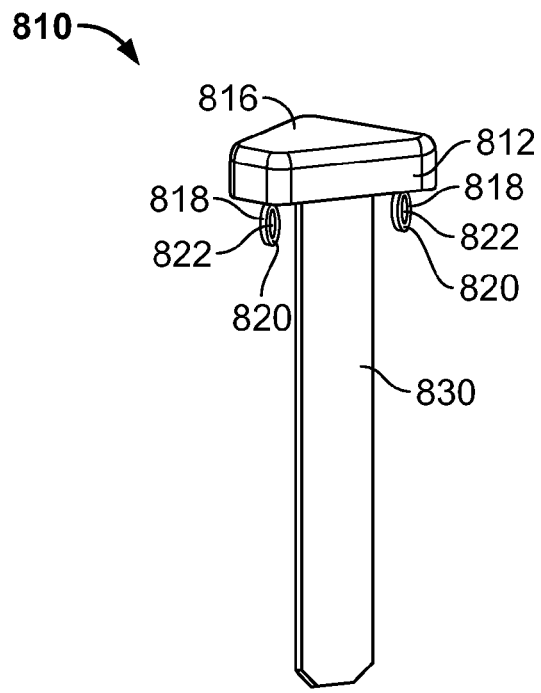
FIG. 8 illustrates a perspective view of another exemplary embodiment of an LED.
Figure 9:
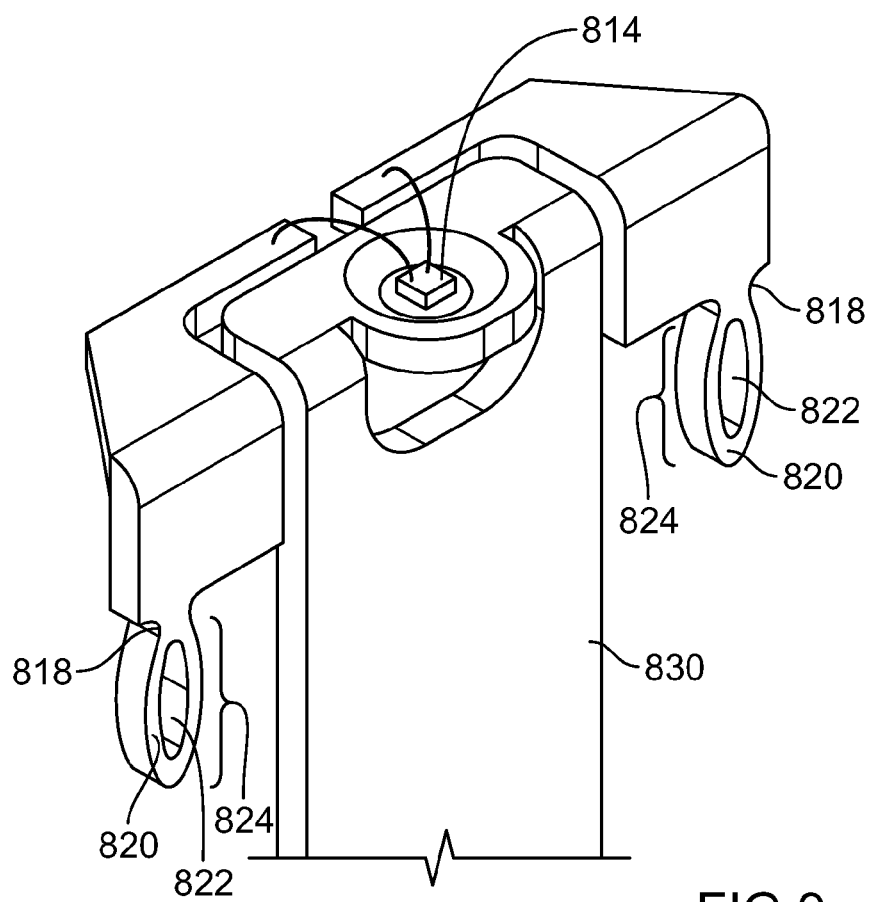
FIG. 9 illustrates a partial perspective view of the exemplary embodiment of FIG. 8.

FIGS. 8 and 9 illustrate another LED module 810 including a body 812, at least one LED chip 814, a lens 816, terminals 818 that include at least one anode and at least one cathode, and a heat sink 830 that may be referred to herein as a heat dissipation member. The LED chip 814 is secured to the body 812 and is covered by the lens 816. The LED chip 814 is in electrical communication with the anode and the cathode to permit an electric current to flow to the LED chip 814. The heat sink 830 is secured in substantial thermal communication to the body 812 to absorb heat generated by the LED chip 814. A distal portion of the terminal 818 is configured as an insertion section 824 of the compliant pin 820.

Figure 10:
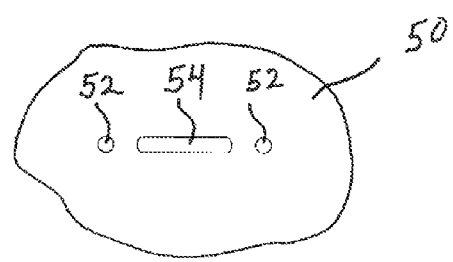
FIG. 10 illustrates a top view of a portion of a printed circuit board including a series of bores configured to receive the embodiment of the LED of FIG. 8.
Figure 11:
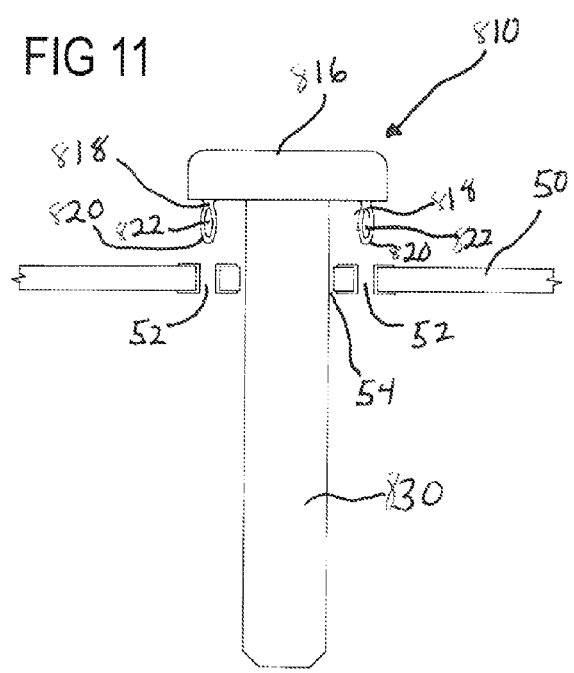
FIG. 11 illustrates a side view of an exemplary embodiment of an LED module having its compliant pins and heat sink installed within bores in a printed circuit board (PCB).
Figure 12:
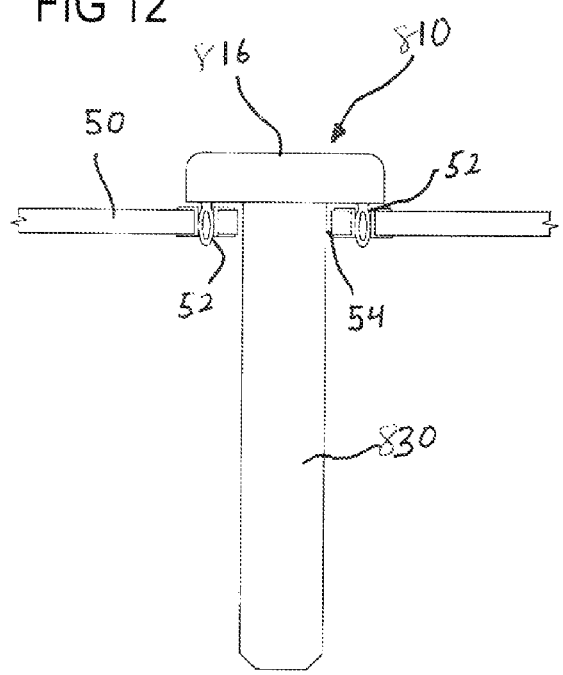
FIG. 12 illustrates a side view of an exemplary embodiment of an LED module with its compliant pins and heat sink positioned within a bores in a printed circuit board.

The compliant pins 820 each define an aperture 822 through an insertion section of the compliant pin 820. Referring to FIGS. 10-12, the aperture 822 permits the insertion section of each of the terminals 818 to be collapsed and positioned within a bore 52 having a smaller width or diameter than the width or diameter of the insertion section of the compliant pin 20 in the relaxed state. At least the insertion section 24 of the compliant pin 20 is configured from a resilient metal. The resilient metal is generally selected for plasticity and elasticity properties as will be recognized by those skilled in the art upon review of the present disclosure. The metal and/or a coating on the metal may be further selected for its high thermal conductivity properties. The insertion section 824 of the compliant pin 820 may be designed to deform during insertion, which may create a strong friction-fit between the pin and the surface of the plated-through hole. In some embodiments, the insertion section 824 of each compliant pin 20 may configured to provide a robust and reliable gas-tight interface with the plated-through hole 52. The mounting of the insertion sections 824 within the through hole 52 may not require a subsequent soldering step. The aperture 22 through the insertion section 824 may be configured with a spring-like design to provide intimate long-term contact force against the barrel 56 of the hole 52. By way of example and not limitation, terminals 18 may include aluminum, nickel, brass, steel, copper, spring copper, iron, gold, silver, tin, or a combination of any of these or other suitable metals.

In some examples, the friction-fit of the compliant pin 20 may provide a gas tight connection with sufficient retention force to maintain a high normal force on the plated through barrel 56 of the PCB 50 via. In certain configurations this may eliminate the need for soldering. The securing of the LED assembly 10 having compliant pins 20 to the PCB 50 may be efficiently and effectively completed upon insertion of the compliant pins 20 into the holes 52. In addition, because the aperture 22 of the compliant pin 20 may permit the compliant pin 20 to resiliently absorb the deformation of the friction fit, instead of substantially deforming the plated-through-hole, it is also possible to remove the compliant pins 20 at a later point if required, without damage to the PCB 50 or need for extensive rework.

An LED assembly 10 having compliant pins 20 may offer a simpler and faster application process. In an illustrative example, applying an LED assembly 10 having compliant pins 20 involves a single operation of pressing the LED assembly 10 so that the compliant pins 20 insert into corresponding through-holes of the PCB 50. The use of a compliant pin 20 on an LED assembly 10 may, in some examples, substantially eliminate some or all of the machines, time and expenses associated with the preparation and cleaning of a solder process. Some examples may advantageously avoid processing problems of soldered LED assemblies such as bridging, cracked solder joints and cold solder joints.

An LED assembly 10 having compliant pins 20 may yield further advantages relative to quality control and inspection. Measuring and logging insertion force data may allow for a non-subjective and non-destructive quality test, assuring electrical and mechanical performance of the LED assembly 10. By monitoring and controlling the insertion force of an LED assembly 10 having compliant pins 20, 100% real-time quality assurance for every LED assembly 10 applied can be provided without the need for a separate inspection operation. This data can be stored and presented to the end-customer to provide necessary quality documentation for every LED assembly 10 applied to every product manufactured.

Figure 3:
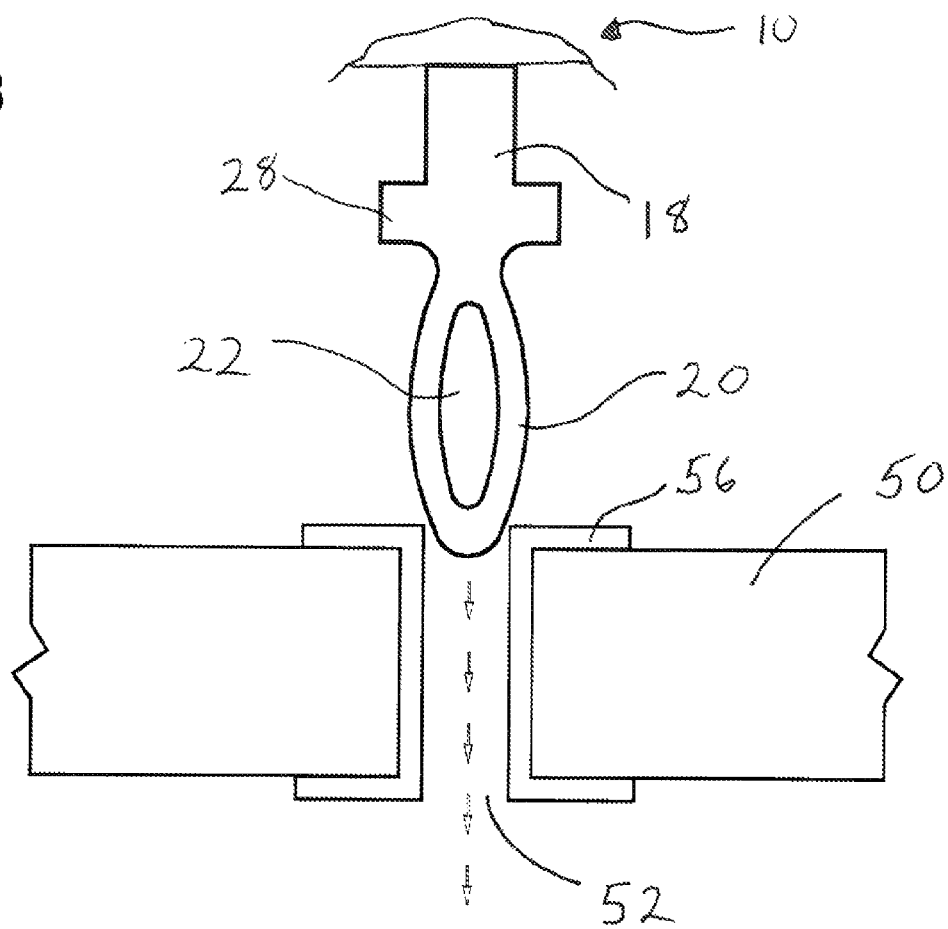
FIG. 3 illustrates a partial side view of an exemplary embodiment of a connector being positioned within a bore in a printed circuit board.
Figure 4:
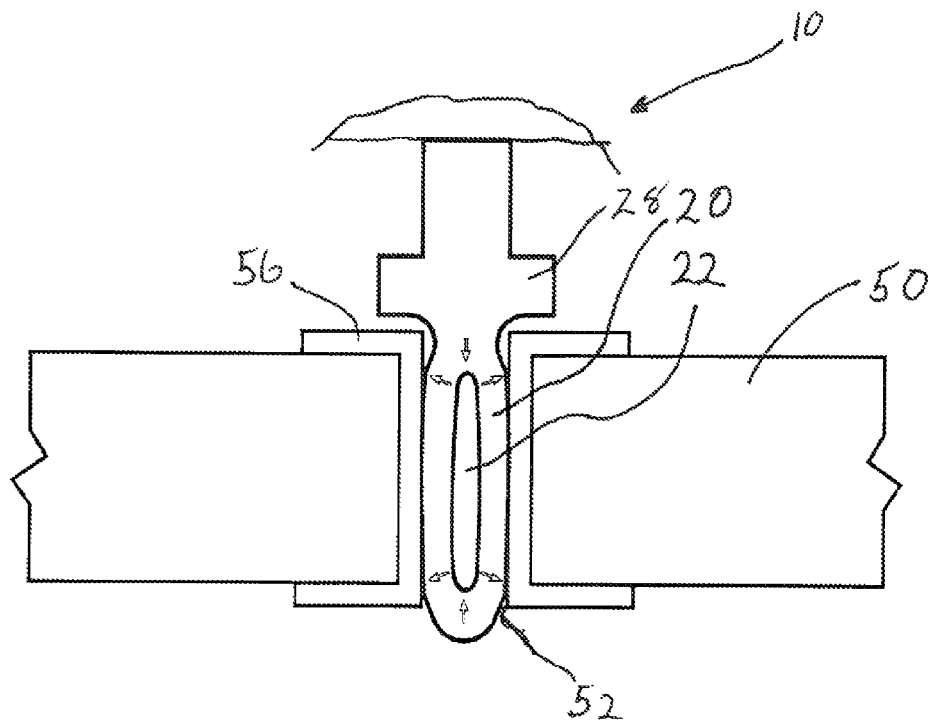
FIG. 4 illustrates a partial side view of an exemplary embodiment of a connector positioned within a bore in a printed circuit board.
Figure 5:
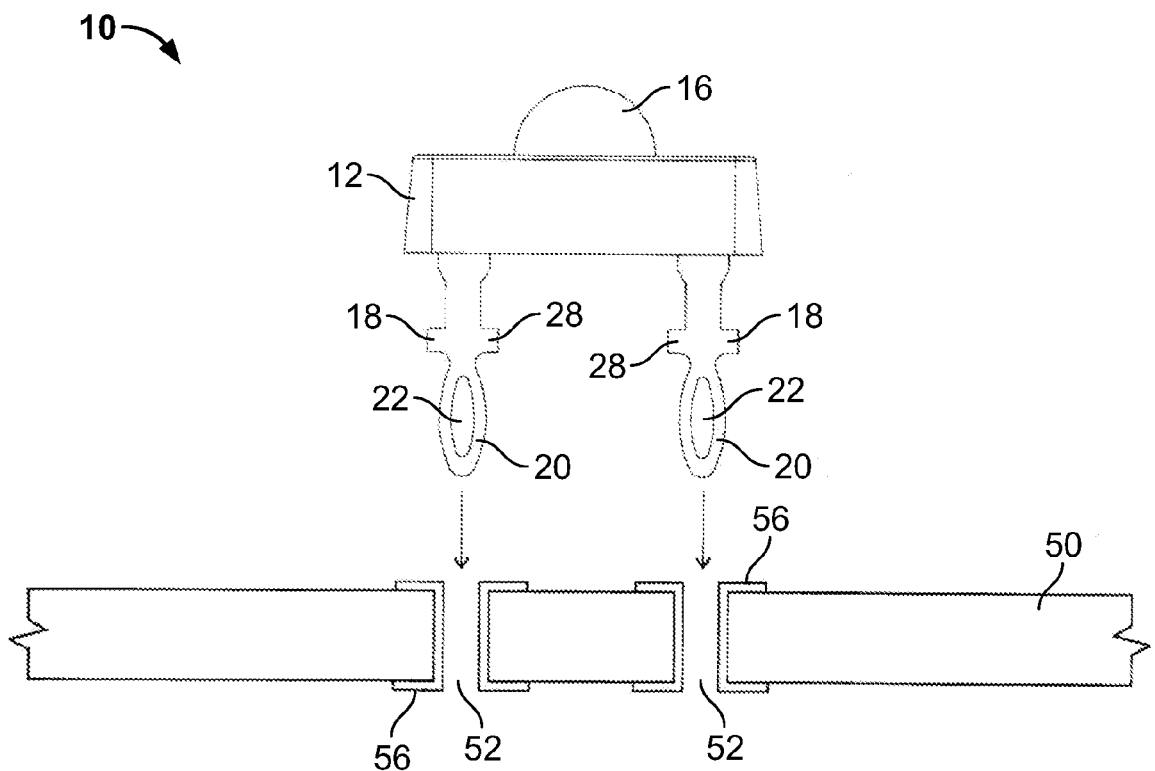
FIG. 5 illustrates a side view of an exemplary embodiment of an LED module having its compliant pins positioned within a bore in a printed circuit board.
Figure 6:
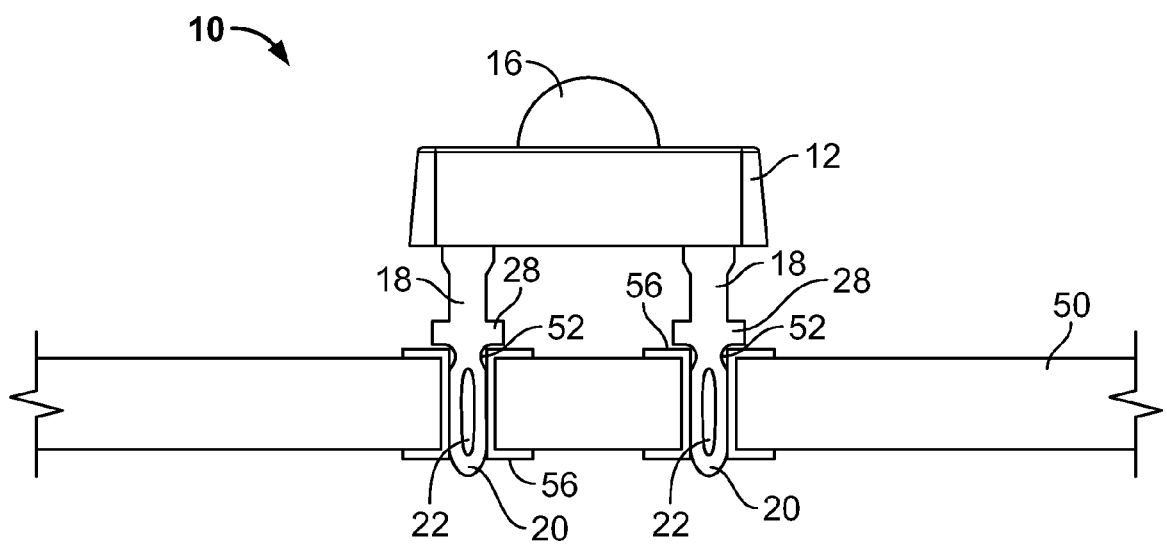
FIG. 6 illustrates a side view of an exemplary embodiment of an LED module with its compliant pins positioned within a bore in a printed circuit board.

FIGS. 3, 4, 5, 6, 11, and 12 illustrate the insertion of the compliant pins 20 of an LED assembly 10 into a hole 52 defined by a barrel 56. In FIGS. 3, 5, and 11, the compliant pins 20, 820 are illustrated in a relaxed and expanded state before insertion into the holes 52. As the compliant pins 20, 820 are inserted into the holes 52, the downward exerted force exerted on the pin (or upward force exerted on the PCB 50) is translated into a compression force that reduces the width of the compliant pin 20, 820 and permits the pin 20, 820 to be fit within the hole 52. The resilient nature of the material of the compliant pin 20, 820 continues to exert an outward force biasing the outer surface of the pin against the walls of the PCB 50 or the barrel 56 defining the hole 52. Thus, the compliant pin 20, 820 is held in compression within the hole 52. As illustrated in FIG. 10, a heat sink aperture 54 may also be defined by the PCB 50 to permit the heat sink 830 to extend through the PCB 50 without contacting the PCB 50.

Although various embodiments have been described with reference to the Figures, other embodiments are possible. For example, a package may include one or more compliant pins attached to the body or other portion of the package. At least one of the compliant pins of this example may be electrically isolated from the LED circuit and may, for example, serve to provide retention of the LED package in the assembly. Such compliant pins for retention, for example, may be advantageously incorporated in some applications to improve reliability of the assembly when exposed to shock or vibration, for example. In some further examples, some of the compliant pins of an LED package may arranged for both electrical connection to an anode or a cathode of an LED in the package and for mechanical retention of the LED package to the circuit substrate.

The circuit substrate may be any flexible, rigid, or semi-rigid substrate that can support the LED package and supply a specified electrical excitation to the LED. For example, LED packages with compliant pins may advantageously yield improved reliability when used with flexible circuit substrates. During flexing and bending of the substrate, the "floating" connection to the compliant pin may better withstand stresses and strains without electrical and/or mechanical cracking or breaking.

Some printed circuit boards, for example, may be populated with solderable components and processed with wave and/or reflow solder operations prior to assembly of the LED packages with compliant pins. Assembling of the LED packages after thermal shock and stresses associated with solder operations may advantageously preserve the maximum lifetime and performance of the LED die.

In various implementations, embodiments of the LED package may have one, two, three, four, or more compliant pins. For example, a package with four (4) parallel strings of LEDs may include at least eight (8) compliant pins. A package with five (5) parallel strings of LEDs may include at least ten (10) compliant pins.

In another example, the heat dissipation member, such as the member 830 of FIGS. 11-12, may be electrically isolated from the circuitry that includes the LED. In another embodiment, the heat dissipation member may be electrically connected to a reference potential, such as safety ground or potential earth, for example. In some examples, an LED-based lighting product may include a low impedance conductive path between the heat dissipation member and an electrical node at a reference potential.

In some examples, a thermal dissipation member may be formed to increase surface area for improved heat transfer. In some examples, the member may include one or more apertures to permit air flow therethrough. Some of the apertures may be elongated into slots. In some examples, the apertures may be formed by a punching operation. In some embodiments, the heat dissipation member may be stamped into a wavy or folded shape. Surface treatment of the heat dissipation member may further include anodization.

In some examples, the thermal dissipation members of one or more LED modules may be in thermal communication with each other. For examples, a thermally conductive interconnection member with multiple receptacles may act as a female plug to make contact with and receive one or more of the heat dissipating members. The thermally conductive interconnection member may provide a path with substantially reduced thermal impedance to ambient air or other thermal heat sink. For example, the thermally conductive interconnection member may provide thermal communication to a highly thermally conductive reflector and/or outer shell of the light engine.

Apparatus and methods for mounting one or more light emitting diode (LED) assemblies disposed are disclosed. In some examples, a compliant pin may secure the LED assembly to a printed circuit board with a solderless connection. Methods for securing the LED assemblies to the PCB include disposing the compliant pin within a hole and biasing the compliant portion of the pin against the walls of the hole. The insertion force may be applied while the LED package and the circuit substrate are substantially exposed to ambient room temperature.

In some examples, an LED light engine may further include a thermal transfer element with a thermally conductive base in substantial thermal communication with a proximal end of the reflector. The thermal transfer element may further include a plurality of thermally conductive members forming paths that extend around the sides of the reflector. In some embodiments, one or more thermally conductive members may extend forward from the base toward the distal of the reflector. Various embodiments may advantageously provide substantially increased surface area to promote heat transfer away from the sealed light chamber, for example, via heat transfer to air or other media.

In various embodiments, the intensity of the LED light engine may controllable, for example, in response to a light dimmer arranged to modulate AC excitation applied to the LED downlight. As the light intensity is decreased in response to a phase and/or amplitude control, the spectral output may, in some embodiments, shift its output wavelengths. In one example, the LED light may smoothly shift color output from substantially white at high intensity to substantially blue or green, for example, at a lower intensity. Accordingly, various exemplary installations may provide controlled combinations of intensity and color.

Some embodiments may provide a desired intensity and one or more corresponding color shift characteristics. Some embodiments may substantially reduce cost, size, component count, weight, reliability, and efficiency of a dimmable LED light source. In some embodiments, selective current diversion circuitry may operate with reduced harmonic distortion and/or improved power factor on the AC input current waveform using, for example, simple, low cost, and/or low power circuitry. Accordingly, some embodiments may reduce energy requirements for illumination, provide desired illumination intensity and color using a simple dimmer control, and avoid illumination with undesired wavelengths.

In some embodiments, the additional circuitry to achieve substantially reduced harmonic distortion may include a single transistor, or may further include a second transistor and a current sense element. In some examples, a current sensor may include a resistive element through which a portion of an LED current flows. In some embodiments, significant size and manufacturing cost reductions may be achieved by integrating the harmonic improvement circuitry on a die with one or more LEDs controlled by harmonic improvement circuitry. In certain examples, harmonic improvement circuitry may be integrated with corresponding controlled LEDs on a common die without increasing the number of process steps required to manufacture the LEDs alone. In various embodiments, harmonic distortion of AC input current may be substantially improved for AC-driven LED loads, for example, using either half-wave or full-wave rectification.

For example, in some embodiments a simple dimmer control may modulate a single analog value (e.g., phase angle, or amplitude) to provide a substantially desired intensity-wavelength illumination. For example, wavelengths for some embodiments may be selected, for example, to substantially emit optimal office illumination at higher AC excitation levels, and shift to a blue or red security lighting at energy-saving low AC excitation levels. In some implementations, some security cameras may have a relatively highly sensitivity, for example, to a wavelength emitted at the low AC excitation levels, thereby maintaining adequate lighting for security and electronic surveillance while permitting substantially reduced energy consumption during inactive hours, for example.

This document discloses examples of technology relating to assembly of LED packages to a circuit substrate for an LED light engine. Related examples may be found in previously-filed disclosures that have common inventorship with this disclosure.

Examples of technology for dimming and color-shifting LEDs with AC excitation are described with reference, for example, to the various figures of U.S. Provisional Patent Application entitled "Color Temperature Shift Control for Dimmable AC LED Lighting," Ser. No. 61/234,094, which was filed by Z. Grajcar on Aug. 14, 2009, the entire contents of which are incorporated herein by reference.

Examples of technology for improved power factor and reduced harmonic distortion for color-shifting LED lighting under AC excitation are described with reference, for example, at least to FIGS. 20A-20C of U.S. Provisional Patent Application entitled "Reduction of Harmonic Distortion for LED Loads," Ser. No. 61/233,829, which was filed by Z. Grajcar on Aug. 14, 2009, the entire contents of which are incorporated herein by reference.

Further embodiments of circuitry for LED light engines are described with reference, for example, at least to FIGS. 1, 2, 5a-5B, 7A-7B, and 10A-10B of U.S. Provisional Patent Application entitled "Architecture for High Power Factor and Low Harmonic Distortion LED Lighting," Ser. No. 61/255,491, which was filed by Z. Grajcar on Oct. 28, 2009, the entire contents of which are incorporated herein by reference.

Although various embodiments of an LED light engine have been described with a screw-type electrical socket interface, other electrical interfaces may be used. For example, a dual post electrical interface of the type used for GU 10 style lamps may be used. Instead of a can-type fixture, some embodiments may include a section of a track lighting-style receptacle to receive the dual post interface of an exemplary lamp. An example of an electrical interface that may be used in some embodiments of a downlight is disclosed in further detail with reference, for example, at least to FIG. 1, 2, 3, or 5 of U.S. Design patent application entitled "Lamp Assembly," Ser. No. 29/342,575, which was filed by Z. Grajcar on Oct. 27, 2009, the entire contents of which are incorporated herein by reference.

Some embodiments may be integrated with other elements, such as packaging and/or thermal management hardware. Examples of thermal or other elements that may be advantageously integrated with the embodiments described herein are described with reference, for example, to FIG. 8B-9 in U.S. Publ. Application 2009/0185373 A1, filed by Z. Grajcar on Nov. 19, 2008, the entire contents of which are incorporated herein by reference.

Embodiments of an LED lamp assembly that includes a substantially sealed light engine and integrated thermal management are described, for example, at least with reference to FIGS. 8 and 16-19 of U.S. Provisional Patent Application entitled "Sealed LED Light Engines," Ser. No. 61/298,289, which was filed by Z. Grajcar on Jan. 26, 2010, and the entire contents of which are incorporated herein by reference.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A module capable of removable assembly of a light emitting diode (LED) to a circuit substrate, the module comprising:
   a housing with a lens and a body member that define an interior cavity;
   an LED die disposed within the interior cavity of the housing and directed to emit light through the lens in response to electrical excitation;
   at least one compliant pin attached to the housing, wherein each of the at least one compliant pins comprises:
   (i) an insertion portion adapted to collapse radially upon insertion into a receptacle of a circuit substrate; and
   (ii) a body portion extending from the insertion portion to the housing; and
   an electrical connection between a terminal of the LED die and the body portion of at least one of the compliant pins,
   wherein the electrical connection provides a low impedance electrical path from one of an anode and a cathode of the LED die to the body portion.

2. The module of claim 1, wherein the insertion portion provides a radial bias against the receptacle so as provide a retention force to substantially resist extraction forces below a threshold extraction force.

3. The module of claim 1, wherein the insertion section comprises an aperture.

4. The module of claim 3, wherein the aperture defines a volume to permit said collapse upon insertion into the receptacle of the circuit substrate.

5. The module of claim 1, wherein the insertion portion has an outer diameter that is greater than an inner diameter of the receptacle when the insertion portion is outside of the receptacle and in a relaxed state.

6. The module of claim 1, further comprising an elongated heat dissipation member attached to the body member and in substantial thermal communication with the LED die.

7. The module of claim 1, wherein the number of compliant pins is at least two.

8. The module of claim 1, wherein the number of compliant pins is at least four.

9. A module capable of removable assembly of a light emitting diode (LED) to a circuit substrate, the module comprising:
- a housing with a lens and a body member that define an interior cavity;
- an LED die disposed within the interior cavity of the housing and directed to emit light through the lens in response to electrical excitation;
- at least one compliant pin attached to the housing, wherein each of the at least one compliant pins comprises:
    (i) an insertion portion adapted to collapse radially upon insertion into a receptacle of a circuit substrate; and
    (ii) a body portion extending from the insertion portion to the housing;
- an elongated heat dissipation member attached to the body member and in substantial thermal communication with the LED die; and
- a low impedance conductive path between the heat dissipation member and an electrical node at a reference potential.

10. A light emitting diode (LED) light engine, comprising:
a circuit substrate with at least one receptacle;
a housing with a lens and a body member that define an interior cavity;
an LED die disposed within the interior cavity of the housing and directed to emit light through the lens in response to electrical excitation; and,
at least one compliant pin attached to the housing, wherein each of the at least one compliant pins comprises:
    (i) an insertion portion adapted to collapse radially upon insertion into one of the at least one receptacle of the circuit substrate; and
    (ii) a body portion extending from the insertion portion to the housing; and
an electrical connection between a terminal of the LED die and the body portion of at least one of the compliant pins,
wherein the electrical connection provides a low impedance electrical path from one of an anode and a cathode of the LED die to the body portion.

11. The LED light engine of claim 10, wherein the insertion portion provides a radial bias against the receptacle so as provide a retention force to substantially resist extraction forces below a threshold extraction force.

12. The LED light engine of claim 10, wherein the insertion section comprises an aperture.

13. A light emitting diode (LED) light engine, comprising:
a circuit substrate with at least one receptacle;
a housing with a lens and a body member that define an interior cavity;
an LED die disposed within the interior cavity of the housing and directed to emit light through the lens in response to electrical excitation;
at least one compliant pin attached to the housing, wherein each of the at least one compliant pins comprises:
    (i) an insertion portion adapted to collapse radially upon insertion into any one of the at least one receptacle of the circuit substrate; and
    (ii) a body portion extending from the insertion portion to the housing;
an elongated heat dissipation member attached to the body member and in substantial thermal communication with the LED die; and
a low impedance conductive path between the heat dissipation member and an electrical node at a reference potential.

* * * * *